United States Patent [19]

Hirai

[11] Patent Number: 5,215,928
[45] Date of Patent: Jun. 1, 1993

[54] METHOD OF MANUFACTURING A SEMICONDUCTOR DEVICE FOR OPTICAL PICK-UP

[75] Inventor: Yoshikazu Hirai, Kanagawa, Japan
[73] Assignee: Sony Corporation, Tokyo, Japan
[21] Appl. No.: 935,543
[22] Filed: Aug. 26, 1992

Related U.S. Application Data

[62] Division of Ser. No. 753,659, Aug. 30, 1991.

[30] Foreign Application Priority Data

Sep. 7, 1990 [JP] Japan .................................. 2-238099

[51] Int. Cl.⁵ .......................................... H01L 31/18
[52] U.S. Cl. .......................................... 437/3; 437/51; 437/904; 437/905; 437/4; 257/432; 257/435; 257/436; 257/749
[58] Field of Search ................. 437/228, 345, 23, 904, 437/905, 51; 357/30; 257/432, 435, 436, 749

[56] References Cited

U.S. PATENT DOCUMENTS

| | | | |
|---|---|---|---|
| 4,499,654 | 2/1985 | Nishizawa et al. | 437/3 |
| 4,523,214 | 6/1985 | Hirose et al. | 437/3 |
| 4,581,099 | 4/1986 | Fukaya et al. | 437/3 |
| 4,837,429 | 6/1989 | Umezawa et al. | |
| 4,977,584 | 12/1990 | Kohno et al. | |

FOREIGN PATENT DOCUMENTS

| | | |
|---|---|---|
| 0115645 | 8/1984 | European Pat. Off. |
| 57-104275 | 6/1982 | Japan |
| 1-136391 | 5/1989 | Japan |

Primary Examiner—Olik Chaudhuri
Assistant Examiner—H. Jey Tsai
Attorney, Agent, or Firm—Hill, Steadman & Simpson

[57] ABSTRACT

Disclosed is a semiconductor device incorporating a plurality of photodiodes and comprising a prism on the device surface. A first and second optical film are deposited on the surface of a first photodiode. Furthermore, the first optical film is formed on the surface of a second photodiode, and the second optical film is provided at the periphery of the photodiode. This structure securely protects the pn junction of the second photodiode during manufacture. In addition, a light-shielding metal film formed at the periphery of the photodiodes has an insulation film deposited thereon, the insulation film containing very loss stress and providing high adhesiveness with respect to the prism. This arrangement enhances the reliability of the semiconductor device.

14 Claims, 8 Drawing Sheets

METHOD OF MANUFACTURING A SEMICONDUCTOR DEVICE FOR OPTICAL PICK-UP

This is a division, of application Ser. No. 753,659, filed Aug. 30, 1991.

BACKGROUND OF THE INVENTION

1. Field of the Invention

The present invention relates to a semiconductor device, and more particularly, to a semiconductor device for use in an optical pick-up of an optical data recording and reproducing apparatus.

2. Description of the Prior Art

Recent years have seen a variety of optical heads (also known as optical pick-ups) developed for use in optical data recording and reproducing apparatuses. These optical pick-ups are illustratively used to detect pit information from compact discs (CD's).

FIGS. 1 and 2 are views of the optical pick-up and its optical integrated circuit which this applicant proposed in Japanese Patent Application No. 1-99221. In FIG. 1, an optical pick-up setup 1 comprises an optical integrated circuit 2, an objective lens 3 and an optical disc 4. In FIG. 2, the optical integrated circuit 2 comprises a semiconductor device 9 mounted on the principal plane of a semiconductor (silicon) substrate 5. The semiconductor device 9 contains a first and a second photodiode 6 and 7 as well as a transistor circuit 8. The transistor circuit 8 is located at a periphery of the photodiodes 6 and 7 and constitutes a differential amplifier or its equivalent receiving signals from these photodiodes. On the surface of the semiconductor substrate 5 containing the photodiodes 6 and 7 as well as the transistor circuit 8, there is fixedly deposited a prism 10 having a semitransparent reflecting surface 10a at an angle of 45 degrees ($=\theta$). Opposite to the semitransparent reflecting surface 10a is an LOP (laser on photodiode) chip with a semiconductor laser 13 mounted on a silicon chip 12 containing a monitoring photodiode 11. When the optical pick-up 1 is in operation, a light beam 14 from the semiconductor laser 13 is reflected on the semitransparent reflecting surface 10a of the prism 10. The reflected light beam passes through the objective lens 3 and is focused onto the optical disc 4. After being reflected by the optical disc 4, the returning optical beam again passes through the objective lens 3, is reflected on the semitransparent reflecting surface 10a, and enters the prism 10. The light beam is detected first by the first photodiode 6. The light beam is then reflected, and is detected by the second photodiode 7. The monitoring photodiode 11 detects the optical intensity of the laser beam emitted by the semiconductor laser 13.

The first and second photodiodes 6 and 7 for optical signal detection are each made of a three-part diode construction. The diodes pick up reproduced signals, and detect focusing and tracking errors. In the semiconductor device 9 containing the photodiodes 6 and 7, reflection control films (also known as optical films) are formed on the diode surfaces. The reflection control films are provided in such a manner that the amount of the light incident on the photodiode 6 via the prism 10 becomes substantially the same as the amount of light incident on the photodiode 7 via the same prism. The reflection control film is provided generally by utilizing (i) a field oxide film (SiO$_2$); (ii) a layer insulation film in the case of multilayer wiring; (iii) an overcoat (passivation) layer; (iv) a double layer film combining any two of the three layers (i) through (iii); or (v) an oxide film constituting the MIS capacity. That is, no extra production stages are added in manufacturing the reflection control film.

The incident light entering the prism 10 is directed only to the photodiodes 6 and 7 and is kept from the transistor circuit 8 by a light-shielding aluminum layer formed thereon.

As described; the semiconductor device 9 has its reflection control films made of the above materials (i) through (v) (especially on the first photodiode 6). One disadvantage of these reflection control films is that they do not fully function as a full-fledged reflection control film structure. Their original purposes require these films to be uneven in thickness and make it difficult for them to attain the level of film thickness precision needed to implement adequate reflection control. If the emphasis were placed on the reflection control function of these films, their original functions as the field oxide film, layer insulation film and/or overcoat layer would have to be sacrificed at least in part. This dilemma may not be apparent when photodiodes are provided as discrete devices. The trouble becomes evident when photodiodes are formed in an IC format (the so-called single-chip format), as in the case of the photodiodes 6 and 7 as well as the transistor circuit 8 being mounted on the same semiconductor substrate 9.

On the other hand, the light-shielding aluminum layer is characterized by its relatively large area. This can cause the so-called stress migration in the aluminum layer when that layer is covered with the overcoat layer, the stress migration possibly leading to the disappearance of the aluminum layer.

One solution to the layer disappearance mentioned above is to selectively remove only the overcoat layer from the light-shielding aluminum layer. This can worsen the adhesive property of the layer relative to the prism 10 and can result in a reduced level of the operational reliability.

SUMMARY OF THE INVENTION

It is therefore an object of the present invention to provide a semiconductor device containing a pair of photodiodes, one photodiode having an optimal reflection control film deposited thereon, the other photodiode being securely protected against damage, whereby the reliability of the device is enhanced.

It is another object of the invention to provide a semiconductor device which prevents stress migration in its light-shielding metal layer and improves the adhesive property of that layer relative to the prism contained therein, whereby the reliability of the device is boosted.

In achieving the foregoing and other objects of the present invention and according to a firs aspect thereof, there is provided a semiconductor device containing a plurality of photodiodes 24 and 25 (these and other reference characters are identified in the accompanying drawings) and having a prism 10 mounted on the surface thereof, the surface of the first photodiode 24 having a first and a second optical films 33 and 34 deposited thereon, the surface of the second photodiode 25 having the first optical film 33 deposited thereon, the second optical film 34 being located at the periphery of the second photodiode 25.

According to a second aspect of the invention, there is provided a semiconductor device containing a plurality of photodiodes 24 and 25 and having a prism 10 mounted on the surface of the device, wherein a light-shielding metal layer 41 located at the periphery of the photodiodes 24 and 25 has an insulation film 33 deposited thereon, the insulation film 33 being subject to a low level of stress and having a high level of adhesiveness with respect to the prism 10.

The first aspect of the invention involves forming the first and the second optical films 33 and 34 of highly precise film thickness on the surface of the first photodiode 24 without the use of a field oxide film, a layer insulation film or an overcoat film. The first and the second optical films 33 and 34 provide optimal reflection control films 35.

The second optical film 34, which is not needed by the second photodiode 25, is allowed to exist at the periphery of the latter. Located where it is, the film 34 protects the first optical film 33 that may be poorly covered at staggered portions in the periphery of the second photodiode 25. When the second optical film 34 is selectively etched, the second photodiode 25 is securely protected against excess etching.

The second aspect of the invention involves depositing the insulation film 33 on the light-shielding metal layer 41 located at the periphery of the photodiodes 24 and 25, the film 33 having low stress and demonstrating good adhesive property relative to the prism 10. This structure prevents the stress migration of the light-shielding metal layer 41 and thus suppresses the metal disappearance, thereby enhancing the adhesiveness to the prism 10 and improving the reliability of operation.

DETAILED DESCRIPTION OF SPECIFIC EMBODIMENT

Figure 1:
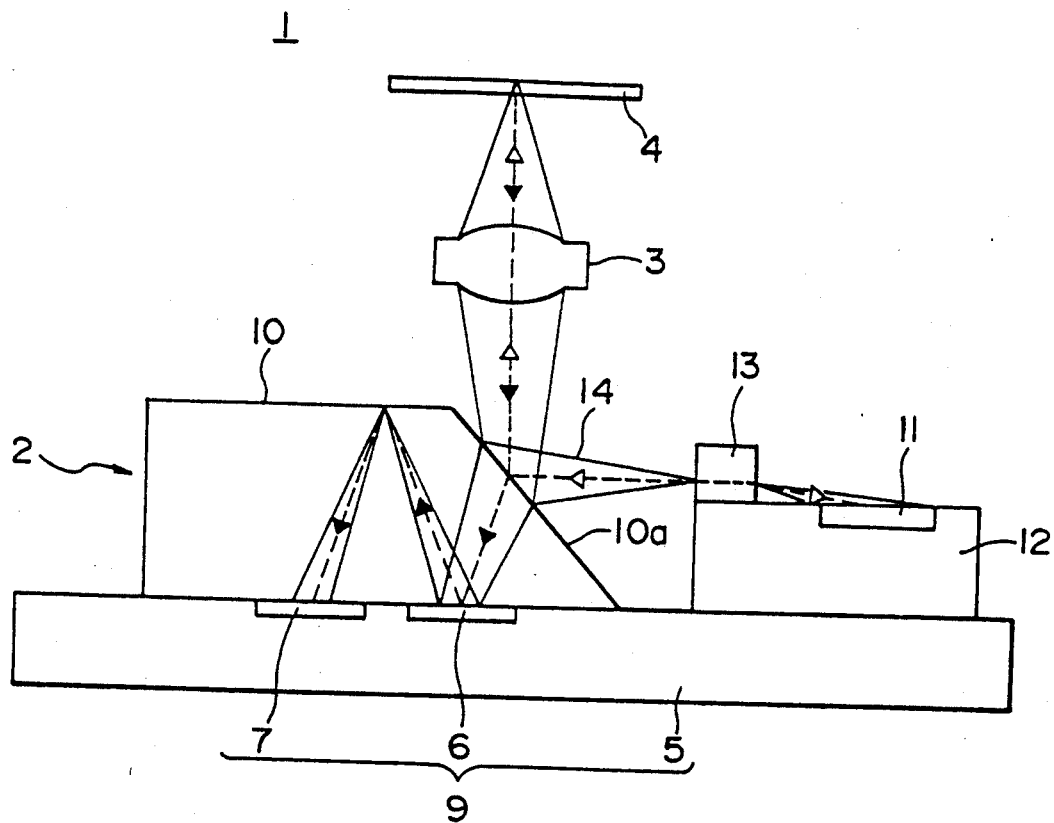
FIG. 1 is a schematic view of the typical prior art optical pick-up.
Figure 2:
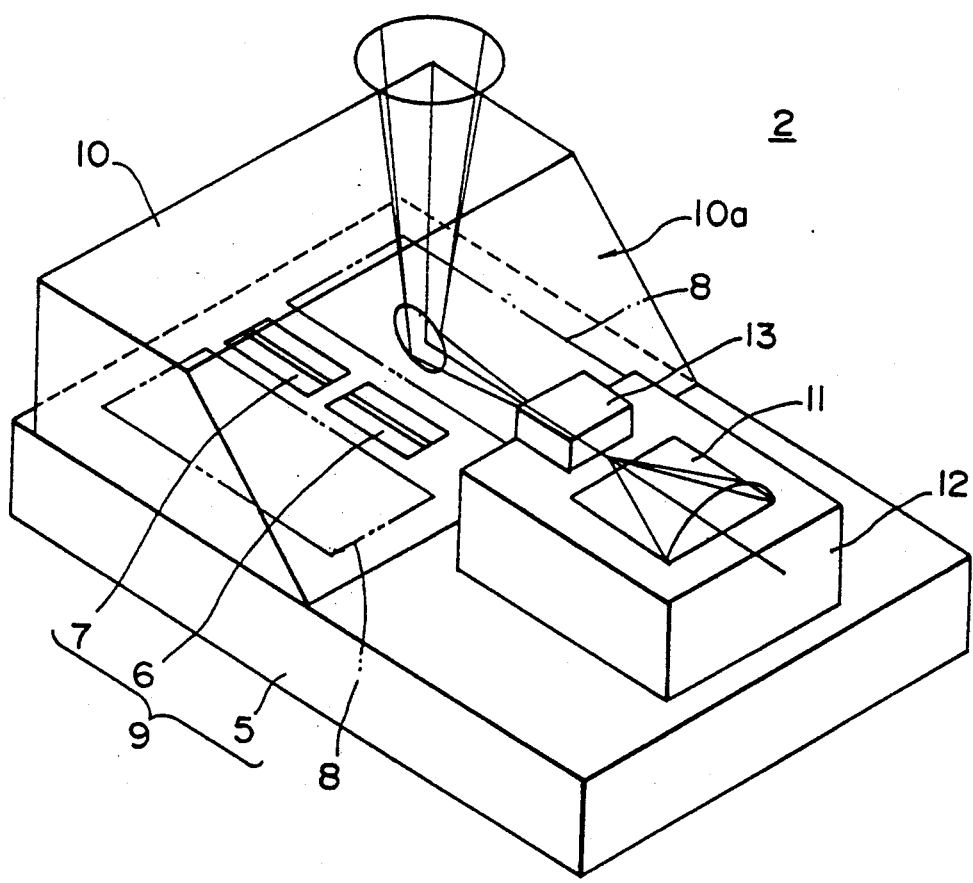
FIG. 2 is a perspective view of the typical optical integrated circuit for use with conventional optical pick-ups.

Preferred embodiments of the invention will now be described with reference to the accompanying drawings. The specific semiconductor devices embodying the invention are all for use with the optical integrated circuit of FIG. 1.

Figure 3:
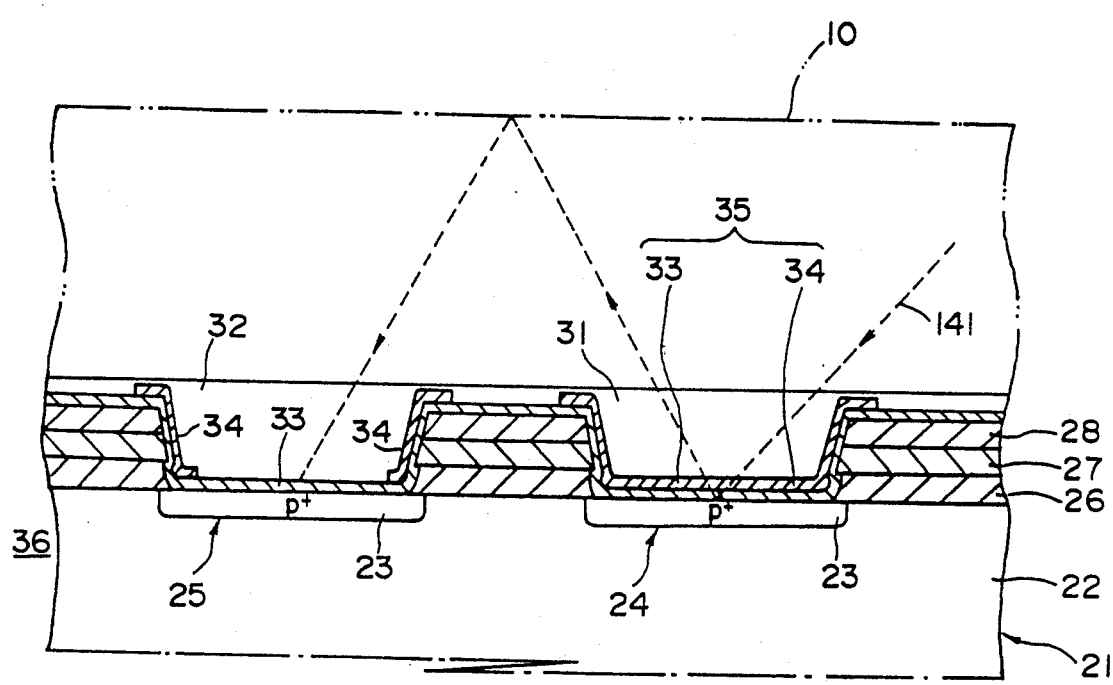
FIG. 3 is a cross-sectional view of a semiconductor device practiced as a first embodiment of the invention.
Figure 4A:
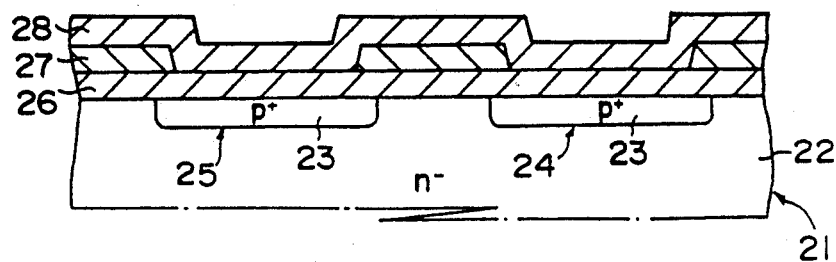
FIGS. 4 (A) through 4 (E) are cross-sectional views of the first embodiment as it is manufactured in consecutive steps.
Figure 4B:
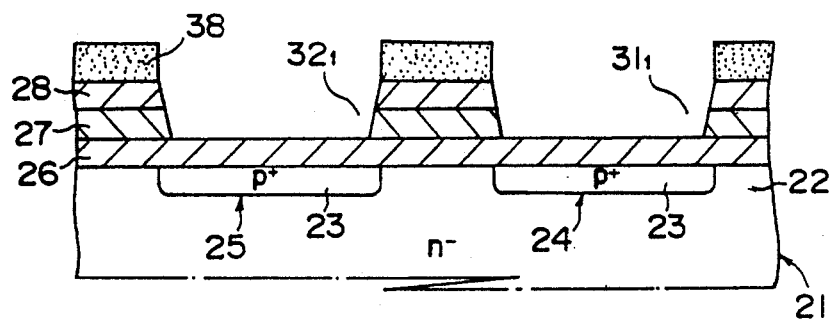
Figure 4C:
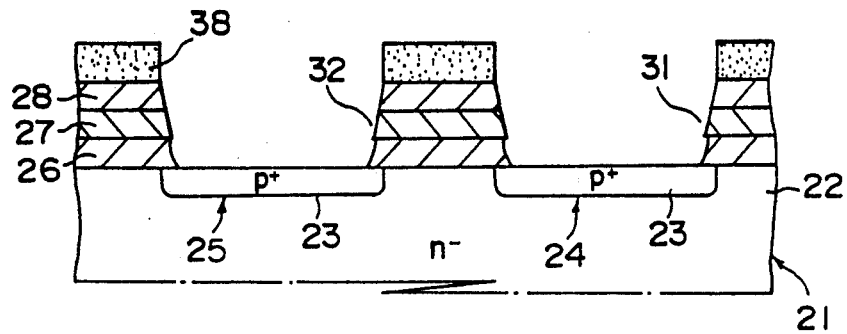
Figure 4D:
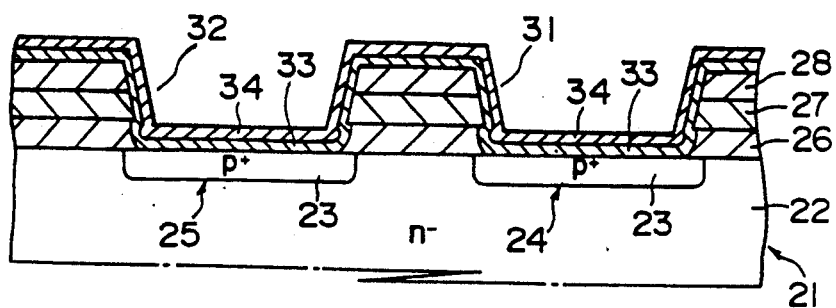
Figure 4E:
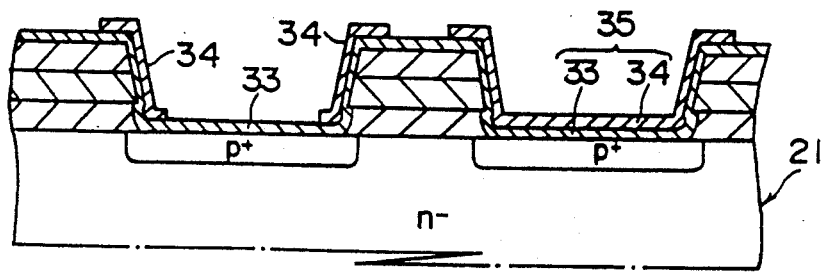

FIG. 3 is a cross-sectional view of the first embodiment of the invention. In the first embodiment, the principal plane of a semiconductor substrate 21 containing a first-conducting type, e.g., n-type, epitaxial layer 22 has a plurality of second-conducting type, e.g., p-type, semiconductor layers 23 that constitute the first and the second photodiodes 24 and 25 for optical signal detection. On the semiconductor substrate 21 are a field oxide film 26 made of a silicon oxide film ($SiO_2$), a layer insulation film 27 made of a plasma SiN film (a silicon nitride film formed by plasma CVD), and an overcoat layer 28 similarly made of the plasma SiN film. Those portions of the three layers which correspond to the first and the second photodiodes 24 and 25 are selectively removed to form openings 31 and 32. On the surface of the first photodiode 24 is the reflection control film 35. The film 35 comprises the first optical film 33 made of the plasma SiO film (silicon oxide film formed by plasma CVD) and the second optical film 34 made of the plasma SiN film. The first optical film 33 is allowed to remain on the surface of the second photodiode 25. The second optical film 34 on top of the first is allowed to remain on those portions corresponding to the periphery of the second photodiode 25, i.e., to the staggered parts of the photodiode 25. The above structure constitutes a semiconductor device 36 practiced as the first embodiment.

With the first embodiment, the first optical film 33 made of the plasma SiO film illustratively has a refractive index $n_1$ of 1.55 and a film thickness $d_1$ of 125.9 nm. The second optical film 34 made of the plasma SiN film illustratively has a refractive index $n_2$ of 1.97 and a film thickness $d_2$ of 98.8 nm.

FIGS. 4 (A) through 4 (E) illustrate the method of manufacturing the first embodiment in consecutive steps. As shown in FIG. 4 (A), the p-type semiconductor layer 23 is formed on the semiconductor substrate 21 containing the n-type epitaxial layer 22. The first and the second photodiodes 24 and 25 are made from the p-type semiconductor layer 23. On the substrate 21 are deposited the field oxide film ($SiO_2$) 26 and the layer insulation film 27 made of the plasma SiN film. After the layer insulation film 27 is opened at the portions corresponding to the photodiodes 24 and 25, the whole substrate surface is covered with the overcoat layer 28 made of the plasma SiN film.

In FIG. 4 (B), those opened edges of the overcoat layer 28 and layer insulation film 27 which correspond to the photodiodes 24 and 25 are selectively removed by plasma etching via a resist mask 38. This plasma etching process leaves openings $31_1$ and $32_1$. At this point, the remaining field oxide film 26 underneath protect the surfaces of the photodiodes 24 and 25. The photodiodes 24 and 25 remain free of damage by plasma etching over their surfaces.

In FIG. 4 (C), the field oxide film 26 is selectively removed by solution etching through the same resist mask 38. The solution etching process leaves openings 31 and 32 revealing the photodiodes 24 and 25.

In FIG. 4 (D), the whole surface including the tops of the photodiodes 24 and 25 exposed to the openings 31 and 32 is covered first with the first optical film 33 and then with the plasma SiN film. The first optical film 33 constitutes the reflection control film and is made of the plasma SiO film (refractive index $N_1 = 1.55$, film thickness $d_1 = 125.9$ nm). The plasma SiN film has a refractive index $n_2$ of 1.97 and a film thickness $d_2$ of 98.8 nm.

In FIG. 4 (E), the second optical film 34 is selectively etched for removal from the entire surface of the first photodiode 24 and from the periphery of the second photodiode 25, i.e., from the area ranging from the perimeter of the photodiode 25 to the top of the staggered portions of the opening 31.

The above etching is illustratively implemented as a plasma etching process using $CF_4/O_2/Ar$ gas at 0.6 torr. The selection ratio of the plasma SiN film to the plasma SiO film is 10 to 1. Under these etching conditions, the etching rate is about 400 nm/min. for the plasma SiN film and 20 nm/min. for the plasma SiO film.

With the above steps executed, the reflection control film 35 of a dual-layer structure is composed of the first and the second optical films 33 and 34 on the surface of the first photodiode 24. The first optical film 33 is deposited on the surface of the second photodiode 25, and the second optical film 34 is left only at the staggered periphery of the second photodiode 25. This is how the semiconductor device 36 is manufactured as the first embodiment of the invention.

In the above-described semiconductor device 36, the reflection control film 35 for the first photodiode 24 is constructed using the first and the second optical films 33 and 34. The two optical films are optimally established without resorting to the field oxide film 26, layer insulation film 27 or overcoat layer 28 known to be uneven in film thickness. Thus the reflection control film 35 is accurate in dimension and stable in performance. When the optical signal $14_1$ is incident on the first photodiode 24 via the prism 10, reflected by the first photodiode 24 and then incident on the second photodiode 25, the amount of incident light is made substantially the same for both the first and the second photodiodes 24 and 25.

As described, the second photodiode 25 has the first optical film 33 deposited on its surface while the second optical film 34 remains at its staggered periphery. Thus the first optical film 33 acts as a protective film for the second photodiode 25 during selective etching of the second optical film 34. The peripherally located second optical film 34 functions as a protective film for the first optical film 33 poorly covered at the staggered periphery. In this manner, the second photodiode 25 is securely protected against the above-described selective etching process.

Figure 6:
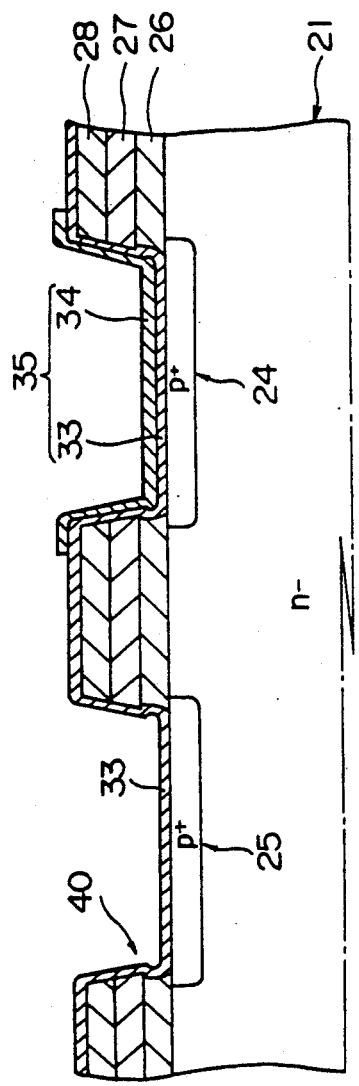
FIG. 6 is a cross-sectional view of another semiconductor device used for reference in describing the embodiments.
Figure 7:
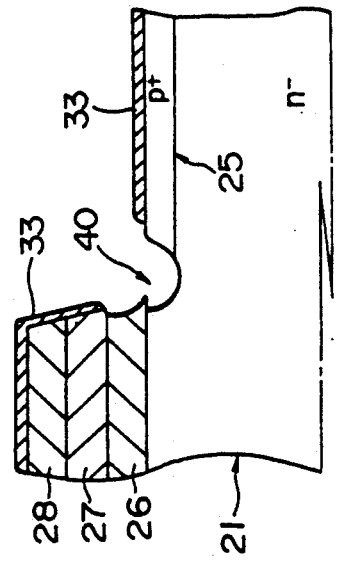
FIG. 7 is a partial cross-sectional view of a key portion of the structure depicted in FIG. 6.

As depicted in FIG. 6, the second optical film 34 may be completely removed from the second photodiode 25 from a characteristic point of view. In practice, the plasma SiO film 33 is poorly covered at a staggered portion 40. (The staggered portion 40 (l=2.4 μm) is covered with the plasma SiO film (first optical film) 33 of about 0.1 μm in thickness). That is, the staggered portion 40 has a thicker film than the flat portion. For this reason, as shown in FIG. 7, the selective etching of the plasma SiN film (second optical film) first etches the plasma SiO film 33 excessively at the staggered portion 40 and thus may destroy the pn junction of the second photodiode 25.

With the first embodiment, by contrast, the second optical film 34 that remains at the periphery of the second photodiode 25 provides room for accommodating the excess etching of the plasma SiN film (second optical film 34). This protects the pn junction from getting etched while stabilizing the etching process. As a result, the semiconductor device of this type is enhanced in performance reliability.

In the selective etching steps illustrated in FIG. 4, the overcoat layer 28 and the layer insulation film 27 are first subjected to the plasma etching that leaves openings therein. The field oxide film at the bottom is then given openings through solution etching. With the surfaces of the photodiodes 24 and 25 thus protected against damage by plasma etching, the reliability of the photodiodes 24 and 25 is improved, and so is the reliability of the semiconductor device 36. The selective etching technique that combines plasma etching with solution etching may also be applied to the manufacture of single-layer reflection control films.

Figure 5A:
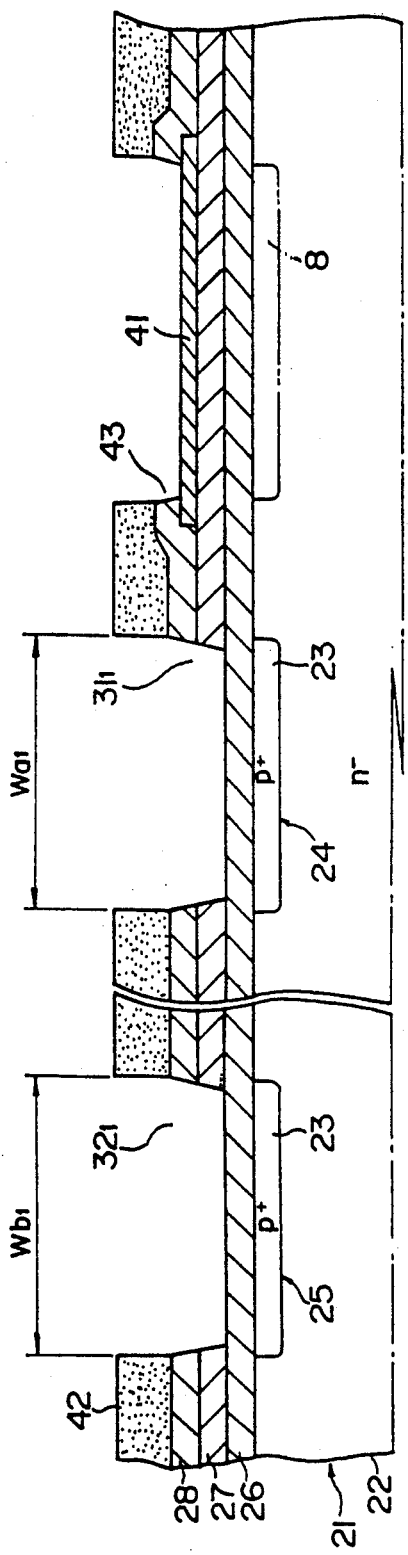
FIGS. 5 (A) through 5 (C) are cross-sectional views of another semiconductor device practiced as a second embodiment of the invention, the views showing the embodiment being manufactured in another series of consecutive steps.
Figure 5B:
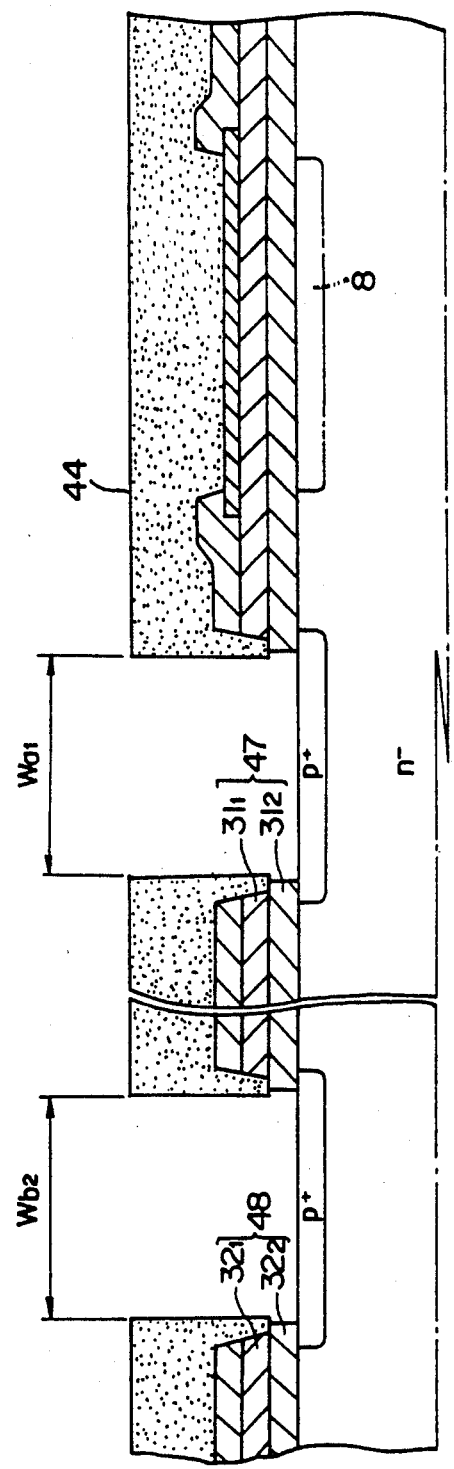
Figure 5C:
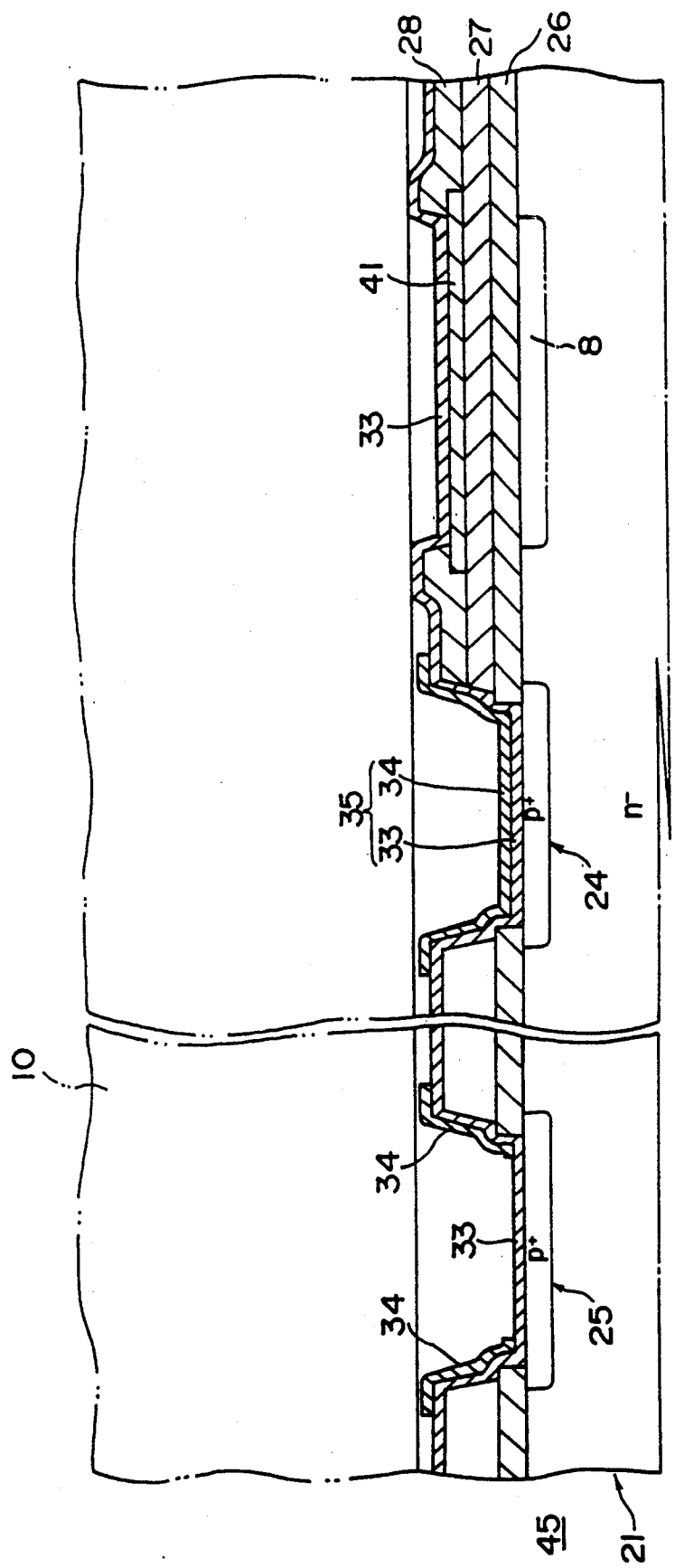

FIGS. 5 (A) though 5 (C) illustrate another semiconductor device practiced as the second embodiment of the invention, which is shown to be manufactured in another series of steps.

In FIG. 5 (A), the principal plane of the semiconductor substrate 21 containing the n-type epitaxial layer 22 has the p-type semiconductor layer 23. The p-type semiconductor layer 23 constitutes the first and the second photodiodes 24 and 25 for optical signal detection. The transistor circuit 8 such as a differential amplifier is provided at the periphery of the photodiodes.

The field oxide film 26 and the layer insulation film 27 are formed consecutively on the substrate 21. The light-shielding aluminum layer (second aluminum layer) 41 is deposited on that area of the layer insulation film 27 which corresponds to the transistor circuit 8. Then openings are selectively made of the layer insulation layer 27 at the portions corresponding to the photodiodes 24 and 25, as described. Thereafter, the overcoat layer 28 is deposited on the whole surface. Then that portion of the overcoat layer 28 which corresponds to the light-shielding aluminum layer 41 and those opened edges of the overcoat layer 28 and layer insulation film 27 which correspond to the photodiodes 24 and 25 are selectively removed by plasma etching via the first resist mask 42. This provides the openings $31_1$, $32_1$ and 43.

In FIG. 5 (B), there is provided a second resist mask 44 which covers the opening 43 revealing the aluminum layer 41 and which comprises openings having widths $W_{a2}$ and $W_{b2}$ smaller than the widths $W_{a1}$ and $W_{b1}$ of the openings $31_1$ and $32_1$ exposing the photodiodes 24 and 25, respectively. It is through this second resist mask 44 that the field oxide film 26 is selectively removed by solution etching. This etching process provides openings $31_2$ and $32_2$. These openings as a whole constitute staggered openings 47 and 48.

In FIG. 5 (C), the second resist mask 44 is removed first. Then the entire surface is covered successively with the first optical film 33 made of the plasma SiO film and with the second optical film 34 made of the plasma SiN film. After that, the second optical film 34 is patterned by plasma etching in such a manner that the film 34 remains on the entire surface of the first photodiode 24 and on the staggered periphery of the second photodiode 25. This provides a semiconductor device 45 as the second embodiment. The prism 10 is bonded with a bonding agent onto the area comprising the photodiodes 24 and 25 as well as the light-shielding aluminum layer 41. Although not shown, the bonding pad is opened last, the plasma SiO film is processed by solution etching, and the overcoat layer (plasma SiN film) immediately underneath is remove by plasma etching.

Figure 8:
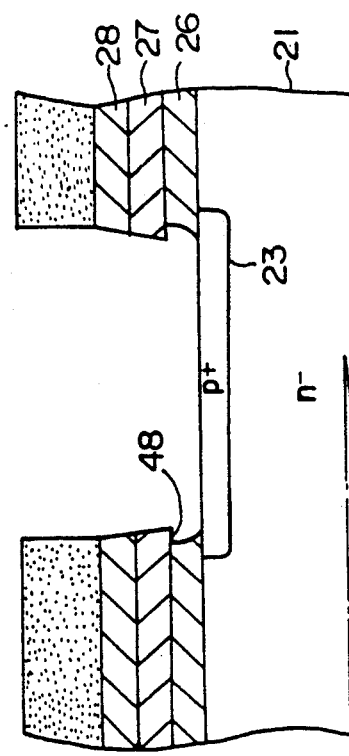
FIG. 8 is a partial cross-sectional view of a key portion of the second embodiment, the view highlighting a distinct difference of the second embodiment from the first.

With this semiconductor device 45, an extension of the thin plasma SiO film 34, i.e., first optical film constituting the reflection control film 35 of the photodiode 24, is formed over the light-shielding aluminum layer 41. This prevents the disappearance of aluminum which might otherwise occur due to the stress migration in the light-shielding aluminum layer 41. At the same time, the passivation of the light-shielding aluminum layer 41 is also available. Furthermore, the prism 10 is bonded more securely. Because the staggered openings 47 and 48 are made using the first and the second resist masks 42 and 44 while the openings of the photodiodes 24 and 25 are being formed, the first and the second optical films 33 and 34 are free of staggered gaps and thus provide excellent reflection control films. These features in turn enhance the reliability of the semiconductor device 45 of this type.

Where a common resist mask 38 is used for both plasma etching and solution etching, as in the case of FIG. 4, the field oxide film 26 can be excessively etched to form an overhang 49, as depicted in FIG. 8. This can lead to the formation of staggered gaps between the first and the second optical films 33 and 34 as these films are formed by CVD. This possible disadvantage is circumvented with the second embodiment utilizing the staggered openings 47 and 48.

In the above embodiment, the plasma SiO film on the light-shielding aluminum layer 41 is formed at the same time as the first optical film 33 when the latter is provided for the photodiodes 24 and 25. Alternatively, the plasma SiO film may be formed in a separate stage, which must be taken into account as an addition to the overall picture of manufacturing. The plasma SiN film may also be formed in a separate stage if the film thickness and the unit stress involved are properly selected.

As many apparently different embodiments of the present invention may be made without departing from the spirit and scope thereof, it is to be understood that the invention is not limited to the specific embodiments thereof except as defined in the appended claims.

What is claimed is:

1. A method of manufacturing a semiconductor device comprising the steps of:
    forming at least a first and a second, second-conducting type semiconductor layer on the principal plane of a first-conducting type semiconductor substrate;
    forming a first insulation film on said semiconductor substrate;
    forming a second insulation film on said first insulation film;
    forming an overcoat film on said second insulation film;
    selectively removing said overcoat film and said first and said second insulation films from said first and said second, second-conducting type semiconductor layers, in order to create at least a first and a second opening in said second-conducting type semiconductor layers;
    forming a first optical film on said semiconductor substrate;
    forming a second optical film on said first optical film; and
    removing those areas of said second optical film which correspond to the inside of said second opening and which correspond to the flat portions outside said first and said second openings.

2. A method of manufacturing a semiconductor device according to claim 1, wherein said first insulation film differs in etching characteristic from said second insulation film.

3. A method of manufacturing a semiconductor device according to claim 1, wherein said second and said first insulation films are removed by anisotropic etching and isotropic etching, respectively.

4. A method of manufacturing a semiconductor device according to claim 1, wherein said first insulation film is made of a silicon oxide film.

5. A method of manufacturing a semiconductor device according to claim 1, wherein said second insulation film is made of a plasma nitride film.

6. A method of manufacturing a semiconductor device according to claim 1, wherein said overcoat film is made of a plasma nitride film.

7. A method of manufacturing a semiconductor device according to claim 1, wherein said first and said second optical films are made of a plasma silicon nitride film each.

8. A method of manufacturing a semiconductor device comprising the steps of:
    forming at least a first and a second, second-conducting type semiconductor layer on the principal plane of a first-conducting type semiconductor substrate, as well as a peripheral circuit portion on said principal plane;
    forming a first insulation film on said semiconductor substrate;
    forming a second insulation film on said first insulation film;
    forming a light-shielding film on that area of said second insulation film which corresponds to said peripheral circuit portion;
    selectively removing said second insulation film from said first and said second, second-conducting type semiconductor layers, in order to create a first and a second opening;
    forming an overcoat film on said semiconductor substrate;
    selectively opening those areas of said overcoat film which correspond to the opened portion of said light-shielding film and to said first and said second openings, in order to create a third, a fourth and a fifth opening;
    creating a sixth and a seventh opening which correspond respectively to said fourth and said fifth openings of said first insulation film and whose diameters are smaller than those of said fourth and said fifth openings;
    forming a first optical film on said semiconductor substrate;
    forming a second optical film on said first optical film; and
    removing those portions of said second optical film which correspond to the inside of said seventh opening and to the flat portions outside said first and said sixth openings.

9. A method of manufacturing a semiconductor device according to claim 8, wherein said first insulation film differs in etching characteristic from said second insulation film.

10. A method of manufacturing a semiconductor device according to claim 8, wherein said second and said first insulation films are removed by anisotropic etching and isotropic etching, respectively.

11. A method of manufacturing a semiconductor device according to claim 8, wherein said first insulation film is made of a silicon oxide film.

12. A method of manufacturing a semiconductor device according to claim 8, wherein said second insulation film is made of a plasma nitride film.

13. A method of manufacturing a semiconductor device according to claim 8, wherein said overcoat film is made of a plasma nitride film.

14. A method of manufacturing a semiconductor device according to claim 8, wherein said first and said second optical films are made of a plasma silicon nitride film each.

* * * * *